(12) United States Patent
Tarutani et al.

(10) Patent No.: US 6,470,144 B1
(45) Date of Patent: Oct. 22, 2002

(54) VAPORIZER FOR CHEMICAL VAPOR DEPOSITION APPARATUS, CHEMICAL VAPOR DEPOSITION APPARATUS, AND SEMICONDUCTOR DEVICE MANUFACTURED THEREBY

(75) Inventors: Masayoshi Tarutani; Tsuyoshi Horikawa; Takaaki Kawahara; Mikio Yamamuka; Shigeru Matsuno; Takehiko Sato, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/444,556

(22) Filed: Nov. 19, 1999

(30) Foreign Application Priority Data

Jun. 4, 1999 (JP) .......................................... 11-157362

(51) Int. Cl.⁷ .............................................. C23C 16/00
(52) U.S. Cl. ...................... 392/396; 392/394; 392/399; 118/724; 118/726
(58) Field of Search ................................ 118/724, 726; 392/394, 396, 397, 398, 399, 400

(56) References Cited

U.S. PATENT DOCUMENTS

| | | | | |
|---|---|---|---|---|
| 4,534,312 A | * | 8/1985 | Shinya et al. ................ | 118/666 |
| 4,963,713 A | * | 10/1990 | Horiuchi et al. ........ | 219/121.43 |
| 5,204,314 A | | 4/1993 | Kirlin et al. | |
| 5,500,081 A | * | 3/1996 | Bergman ................... | 156/646.1 |
| 5,776,254 A | * | 7/1998 | Yuuki ......................... | 118/726 |
| 5,834,060 A | * | 11/1998 | Kawahara .................. | 429/255.3 |
| 5,835,677 A | * | 11/1998 | Li et al. ...................... | 392/394 |
| 6,039,808 A | * | 3/2000 | Toyoda ....................... | 118/726 |
| 6,074,487 A | * | 6/2000 | Yoshioka et al. ........... | 118/726 |
| 6,210,485 B1 | * | 4/2001 | Zhao ........................... | 118/726 |
| 6,258,170 B1 | * | 7/2001 | Somekh ....................... | 118/726 |

FOREIGN PATENT DOCUMENTS

| | | |
|---|---|---|
| JP | 7-268634 | 10/1995 |
| JP | 8-186103 | 7/1996 |
| JP | 10-251850 | * 9/1998 |

OTHER PUBLICATIONS

"Surface Morhologies and Electrical Properties of (Ba, Sr)TiO₃ Films Prepared by Two–Step Deposition of Liquid Source Chemical Vapor Deposition", T. Kawahara et al., Jpn. J. Appl. Phys. vol. 34, Sep. 1995, pp. 5077–5082.

* cited by examiner

Primary Examiner—Richard Bueker
(74) Attorney, Agent, or Firm—McDermott, Will & Emery

(57) ABSTRACT

There are provided a vaporizer for use with a CVD apparatus and a CVD apparatus, capable of long-term, reliable and efficient production of CVD film with good properties, and a semiconductor device manufactured employing the same. The vaporizer for use with a CVD apparatus is comprised of a material introducing tube, a vaporization chamber and a cooling member. The material introducing tube transports a mixture containing a solution of a material for the CVD film and a gas carrying the solution. The vaporization chamber is connected to the material introducing tube to vaporize the material introduced through the material introducing tube. The cooling member cools that portion of the material introducing tube adjacent to the vaporization chamber.

4 Claims, 5 Drawing Sheets

VAPORIZER FOR CHEMICAL VAPOR DEPOSITION APPARATUS, CHEMICAL VAPOR DEPOSITION APPARATUS, AND SEMICONDUCTOR DEVICE MANUFACTURED THEREBY

BACKGROUND OF THE INVENTION

1. Field of the Invention

The present invention relates to chemical vapor deposition (CVD) apparatuses, vaporizers for CVD apparatuses, and semiconductor devices, and in particular to a CVD apparatus capable of long-term, reliable production of CVD film with good quality, a vaporizer for a CVD apparatus, and a semiconductor device manufactured thereby.

2. Description of the Background Art

In recent years, there has been a further advancement in the integration of devices such as semiconductor memory. For instance, there has been a rapid advancement in enhancing the integration of a dynamic random access memory, quadrupled in the number of bits in three years. Such integration aims at achieving rapid device operation, reducing device power consumption, reducing device cost, and the like. While semiconductor memory and the like are highly integrated as described above, a capacitor, a component of such devices, is required to store a certain quantity of electric charge. Thus, along with the advancement in the integration of devices, there have also been developed a technique for forming a material for a capacitor's dielectric film into an extremely thin film, a technique for forming a capacitor of a complex, three-dimensional structure to increase the surface area of the capacitor, and other techniques.

Main traditional materials for dielectric film include silicon oxide ($SiO_2$) film. Due to its physical properties, however, it is extremely difficult to further reduce currently used silicon oxide film in thickness, and it has been accordingly noted that silicon oxide film is replaced with a material having a higher dielectric constant that silicon oxide film, since using a material having a dielectric constant higher than conventional as a material for a capacitor's dielectric film can increase the density of the electric charge stored in the capacitor. When a material of a high dielectric constant is used as a dielectric film to achieve a storage of electric charge comparable to that achieved by a conventional capacitor, the dielectric film may have a thickness greater than that formed of silicon oxide film. If a dielectric film may have a thickness increased to some extent, the process for forming the dielectric film can be improved in controllability and the dielectric film can thus be enhanced in reliability. That is, there are a multitude of advantages in using a material of a high dielectric constant as a dielectric film material.

Such capacitor's dielectric film is also sought to have small current leakage as an important characteristic thereof. To achieve such small current leakage, in general the dielectric film preferably has an equivalent $SiO_2$ film thickness of no more than 0.5 nm, and a leakage current density of no more than $2 \times 10^{-7}$ $A/cm^2$ when a voltage of 1V is applied.

The density of electric charge stored in a capacitor and other properties also significantly depend on the material for the capacitor's electrode, which is required to be highly stable and have good workability.

Furthermore it is also considered to use a material of a lower electrical resistance than conventional as a wiling material in a highly integrated semiconductor device as above to operate the device rapidly.

As such, oxide-type dielectrics including tantalum oxide ($Ta_2O_5$), lead zirconate titanate (PZT), lead lanthanum zirconate titanate (PLZT), strontium titanate (ST), barium titanate (BT), and barium strontium titanate ((Ba, Sr) $TiO_2$ (hereafter referred to as BST)) are considered as possible materials for a capacitor's dielectric film. Furthermore, platinum, ruthenium, iridium and a conductive oxide thereof or $SrRuO_3$ are considered as possible materials for a capacitor's electrode. Copper is also considered as an alternative wiring material to aluminum, a conventional wiring material.

Generally, in forming a thin film on a capacitor's electrode of a micro-fabricated memory device having fine steps it is preferable to employ a film deposition method through a chemical vapor deposition (CVD) which allows complex geometry to be covered satisfactorily. The CVD is also most advantageous in simplifying the process. In this CVD, an organometallic compound containing a predetermined type of metal is used as a material for a thin film. Vaporizing the material and spraying the vaporized material onto a substrate allows formation of a thin film with a high dielectric constant or capacitor's electrode. However, most materials conventionally used for forming a thin film with a high dielectric constant are disadvantageously not stable nor have good vaporization characteristics.

Under such circumstances, some of the Inventors have invented, as disclosed in Japanese Patent Laying-Open No. 7-268634, a CVD film material with a greatly enhanced vaporization characteristic by dissolving a solid material such as an organometallic compound in an organic solvent called tetrahydrofuran or THF ($C_4H_8O$) to provide a solution thereof. Some of the Inventors have also invented, as disclosed in Japanese Patent Laying-Open No. 8-186103, a CVD apparatus for use with a liquid material that is capable of vaporizing the above-mentioned solution of the material (a liquid material) and supplying it stably to the CVD apparatus's reaction chamber. Furthermore, some of the Inventors have succeeded in using the CVD apparatus disclosed in Japanese Patent Laying-Open No. 8-186103 to form a thin film of a high dielectric constant having good surface morphology and electrical characteristics. Some of the Inventors have also invented, as disclosed in U.S. patent application Ser. No. 09/150,212, a CVD apparatus and CVD process condition allowing stable vaporization of a liquid material in a vaporization chamber.

It has been found, however, that it is difficult to use such CVD apparatus for use with a liquid material for a long term to reliably form thin films of a high dielectric constant with good characteristics. As the Inventors examined the apparatus, it has been found that the problem is caused by a solid component of an organometallic compound or the like that is separated from the liquid material in the CVD apparatus's vaporization chamber. This will be described in detail below with reference to the drawings.

FIG. 8 schematically shows a vaporizer as a vaporizer for use with a CVD apparatus related to the present invention. The vaporizer will now be described with reference to FIG. 8.

Referring to FIG. 8, a vaporizer 121 as the vaporizer includes a body 121a of the vaporizer and an upper lid 121b of the vaporizer. A rod heater 122 is varied in body 121a and upper lid 121b. Upper lid 121b is provided with a vaporizer inlet 121c for supplying into vaporizer 121 a mixture of a liquid material and nitrogen gas as a carrier gas. Inlet 121c is connected to a material supply tube 126a via a connecting member 121d. Material supply tube 126a is connected via a connecting member to a material transport tube (not shown) connected to a container holding the liquid material. Body 121a is also provided with a vaporizer outlet 101b for exhausting a vaporized material. Outlet 101b is connected via a transport tube to a reaction chamber for forming a CVD film. Outlet 101b and the transport tube connected thereto are provided with a heater 124.

Herein the material transport tube is typically a narrow tube of stainless steel. Material supply tube 126a is a narrow tube, e.g., of polytetrafluoroethylene (PTFE), polyimide. Body 121a and upper lid 121b are formed of metal, preferably a highly heat-conductive metal, such as aluminum, copper. Inlet 121c and outlet 101b and connecting member 121d may be formed, e.g., of stainless steel.

In such vaporizer 121, from an end of material supply tube 126a that is located internal to vaporizer 121 a liquid material is scattered or sprayed together with a carrier gas and thus supplied into vaporizer 121. The liquid material introduced into vaporizer 121 collides against the internal wall of vaporizer 121. Since body 121a and upper lid 121b have been heated by rod heater 122, the liquid material colliding against the internal wall of vaporizer 121 can vaporize instantly. The vaporized liquid material (referred to as a "gaseous material" hereinafter) is exhausted from outlet 101b and thus supplied to a reaction chamber of the CVD apparatus.

Herein, to form a BST film in the CVD apparatus, vaporizer 121 is supplied with liquid materials respectively prepared by dissolving solid Ba $(DPM)_2$, Sr $(DPM)_2$, TiO $(DPM)_2$, in THF. It should be noted that DPM represents dipivaloylmethane of $\beta$-diketon type.

Using such liquid materials as above in a CVD apparatus for use with liquid materials provided with such a vaporizer as shown in FIG. 8, has allowed a thin film to be formed of a material of a high dielectric constant such as the BST film. However, the Inventors have found that the CVD apparatus provided with the FIG. 8 vaporizer has a disadvantage, as described below, when it is used for a long period of time to provide a film-formation process using such a liquid material as above.

More specifically, referring to FIG. 8, vaporizer 121, heated by rod heater 122, transfers heat to material supply tube 126a connected to vaporizer 121 and thus also heats material supply tube 126a. As a result, the solvent of a liquid material such as THF can partially be vaporized in material supply tube 126a. When an organic solvent such as THF partially vaporizes, an organometallic compound as a solute dissolved in the liquid material can partially be separated as a solid in material supply tube 126a. Such separation of the organometallic compound serving as a CVD film material (referred to as a "vaporization-attributable residue" hereinafter) will accumulate internal to vaporizer 121 and material supply tube 126a. Such accumulated residue negatively affects vaporization characteristics of the liquid material. Thus the gaseous material cannot be sent reliably from the vaporizer to the reaction chamber, disadvantageously resulting in degraded properties of a produced CVD film.

Furthermore, the vaporization-attributable residue that is accumulated, e.g., in vaporizer 121 can also be exhausted from outlet 101b as a powdery, solid component together with the vaporized material and introduced into the reaction chamber. In such a case the residue can be taken as an impurity into a CVD film in the reaction chamber and thus degrade the quality of the CVD film. This has been a cause of unsatisfactory operation of memory devices and the like which employ such CVD film. Furthermore, since using the CVD apparatus as described above for a long period of time results in a vaporization-attributable residue accumulating in vaporizer 121 as an impurity, the CVD apparatus used for an increased period of time has an increased possibility of the problems as described above and can thus not provide long-term, reliable production of CVD film with good quality.

Furthermore, the vaporization of an organic solvent, such as THF, partially heated and vaporized in material supply tube 126a can vary the flow rate of that mixture of a liquid material and a carrier gas which is supplied to vaporizer 121 via material supply tube 126a. This will vary the supply rate of the liquid material supplied to vaporizer 121 and hence the rate at which the material vaporized in vaporizer 121 is supplied to the reaction chamber. Thus the reliability of the CVD film formation process is degraded, and if the material supply rate varies significantly a CVD film may have an uneven composition. As a result, semiconductor devices, such as memory devices, using such CVD film have problems including unsatisfactory operation.

Furthermore, while material supply tube 126 is formed, e.g., of PTFE, as described above, such material is less heat-resistive than typical metal materials. Thus, when material supply tube 126a receives the heat from vaporizer 121, material supply tube 126a can be deformed, degraded in its properties and the like, and thus must be replaced frequently. Thus the process for CVD film formation cannot be provided continuously for a long period of time, resulting in reduced production efficiency of semiconductor devices such as memory devices. This prolongs the process for manufacturing semiconductor devices and thus disadvantageously increases the cost for manufacturing the same.

Furthermore, a vaporization-attributable residue accumulating in vaporizer 121 adheres directly to the metal members configuring body 121a and upper lid 121b of the vaporizer 121. Accordingly, body 121a and upper lid 121b must be cleaned to remove the residue therefrom. Such cleaning operation is a significant disadvantage in efficiently operating the CVD apparatus, since it is a cumbersome operation, requiring a long time. Such existence of a vaporization-attributable residue that prevents effective operation of the CVD apparatus results in increasing the cost for manufacturing semiconductor devices.

U.S. Pat. No. 5,204,314 discloses another vaporizer for a CVD apparatus proposed by Kirlin et al, Advanced Technology Materials, Inc., U.S. This proposed vaporizer, however, also has a similar problem, suffering from a solid matter produced in the vapor of a material and blocking up a tube.

SUMMARY OF THE INVENTION

One object of the present invention is to provide a CVD apparatus capable of long-term, reliable and efficient production of CVD film with good properties.

Another object of the present invention is to provide a vaporizer for use with a CVD apparatus capable of long-term, reliable and efficient production of CVD film with good quality.

Still another object of the present invention is to provide a semiconductor device comprised of a CVD film having good film quality.

In one aspect of the present invention, the vaporizer for a CVD apparatus is comprised of a material introducing tube, a vaporization chamber and a cooling member. The material introducing tube transports a mixture containing a solution of a CVD film material and a gas carrying the solution. The vaporization chamber is connected to the material introducing tube and vaporizes the material introduced through the material introducing tube. The cooling member cools that portion of the material introducing tube which is adjacent to the vaporization chamber.

Since the cooling member can maintain a low temperature of the portion of the material introducing tube adjacent to the vaporization chamber, a solvent component of the material solution does not vaporize in the material introducing tube and hence the CVD film material does not separate from the material solution in the material introducing tube. This can prevent a variation in the Material's vaporization characteristics in the vaporization chamber that is attributable to a separated CVD film material (or a vaporization-attributable residue). This allows stable vaporization of the CVD film material and hence stable supply of the vaporized CVD film material to a reaction chamber connected to the vaporization chamber to form CVD film. Consequently, the CVD film can be provided with superior film quality.

Furthermore, since a vaporization-attributable residue is not produced, the residue cannot be delivered from the vaporization chamber as particles of an impurity nor arrive at the reaction chamber. Thus such residue cannot be mixed into a CVD film nor degrade the quality of the CVD film. This allows reliable production of CVD film with good quality. Furthermore, if a CVD apparatus with the vaporizer of the present invention is used to provide a dielectric film for capacitors of memory devices and the like, the dielectric film can have reduced defects, providing an improved product yield of memory devices.

Furthermore, the vaporizer of the present invention for use with a CVD apparatus can also prevent a solution from vaporizing in the material introducing tube, to reduce a variation in the flow rate of a mixture supplied to the vaporization chamber through the material introducing tube that would be introduced when a material solution vaporizes in the material introducing tube. Thus the vaporizer can reduce a variation in the quality of a CVD film that would otherwise be attributed to such variation in the flow rate of the material.

Furthermore, a portion of the material introducing tube adjacent to the vaporization chamber can be maintained at a low temperature and can thus have a temperature prevented from elevating due to the heat from the vaporization chamber. Thus the material introducing tube can be free of a degradation in its material that would otherwise be caused by such temperature elevation. Thus the material introducing tube can be used continuously for a long term.

In one aspect above the vaporizer for a CVD apparatus may include a heat sink formed to transfer heat from a portion thereof adjacent to the vaporization chamber.

In the vaporizer of the present invention for use with a CVD apparatus, a mixture containing a material solution and a gas carrying the solution is supplied to a vaporization chamber through a material introducing tube and the material (the mixture) can thus be delivered through the material introducing tube at a flow rate higher than a liquid material conventionally introduced directly into the vaporization chamber. Thus the temperature elevation of the material introducing tube that is attributed to the heat for vaporizing the material in the vaporization chamber can be smaller than when the liquid material is introduced directly into the vaporization chamber. Accordingly, a relatively simple cooling member, such as a heat sink connected to the material introducing tube, can be used to maintain an adequately low temperature of the material introducing tube. Providing a cooling member simpler in configuration than conventional cooling members can also reduce the cost for manufacturing the vaporizer for use with a CVD apparatus.

Furthermore, the shape of such heat sink can readily be adjusted to readily change the temperature to which the material introducing tube is cooled and thus optimally cool the material introducing tube considering CVD film material types, CVD film forming conditions, and the like.

In one aspect above, in the vaporizer for a CVD apparatus the cooling member may include a coolant path and a coolant supplying member. The coolant path may have a portion adjacent to the vaporization chamber that transfers heat, and the coolant supplying member may introduce a coolant to the coolant path.

As such, if the conditions for vaporizing a material, such as the temperature of the vaporization chamber, are changed variously the amount of the coolant introduced to the coolant path can be adjusted to set any temperature of the portion of the material introducing tube adjacent to the vaporization chamber.

In one aspect above, in the vaporizer for a CVD apparatus the cooling member may include a Peltier element formed to transfer heat from a portion thereof adjacent to the vaporization chamber.

As such, by varying the level of the current supplied to the Peltier element the amount of heat absorbed therein can be varied to readily set any temperature of the portion of the material introducing tube adjacent to the vaporization chamber if the conditions for vaporizing a material are varied. Thus, the temperature of the material introducing tube can be set at a low temperature to prevent vaporization of the material solution and hence more reliably prevent production of a vaporization-attributable residue in the material introducing tube.

In one aspect above, in the vaporizer for a CVD apparatus a heat transferring member may also be provided around the portion of the material introducing tube adjacent to the vaporization chamber and the cooling member may be provided in contact with the heat transferring member.

As such, the cooling member can be provided from the portion of the material introducing tube adjacent to the vaporization chamber with the heat transferring member therebetween, resulting in an enhanced degree of freedom in designing the vaporizer.

In one aspect above, the vaporizer for a CVD apparatus may be comprised of a control member disposed to control the cooling member to change the temperature of the material introducing tube.

As such, the temperature of the material introducing tube can be varied as desired and thus set to a low temperature which prevents vaporization of the material solution. This can more reliably prevent production of a vaporization-attributable residue in the material introducing tube.

Furthermore, since the material introducing tube is not heated above a predetermined temperature, a material forming the tube does not suffer the degradation attributable to the heat of the tube otherwise heated.

In one aspect above, in the vaporizer for a CVD apparatus the CVD film material may contain an organometallic compound and the solution may be obtained by dissolving the material in an organic solvent.

In one aspect above, in the vaporizer for a CVD apparatus the cooling member may cool the material introducing tube to no more than 80° C.

In one aspect above, the vaporizer for a CVD apparatus may be comprised of a heating member disposed to heat the interior of the vaporization chamber in a range of 230 to 300° C., and a pressure controlling member disposed to provide a controlled pressure of no more than 30 Torr in the vaporization chamber.

As such, the conditions as above in the vaporization chamber are particularly suitable for vaporizing a material for forming a thin film of a high dielectric constant and thus allow long-term, reliable production of such thin film of a dielectric constant with good quality.

In one aspect above, in the vaporizer for a CVD apparatus a covering member may be provided on and thus cover an internal wall surface of the vaporization chamber.

As such, if an accident or the like produces a vaporization-attributable residue that would otherwise adhere to the internal wall surface of the vaporization chamber, the residue adheres to the covering member rather than adheres directly to the internal wall surface of the vaporization chamber. The covering member with the residue adhering thereto can be replaced to readily clean the interior of the vaporization chamber. Thus the maintenance time for the vaporizer can be reduced, resulting in an enhanced operating efficiency of the CVD apparatus, and the CVD apparatus can also be used reliably for a long term.

Furthermore, replacing the covering member to constantly keep clean the interior of the vaporization chamber, allows CVD film to be formed constantly with good quality.

In another aspect of the present invention, the vaporizer for a CVD apparatus is comprised of a vaporization chamber disposed to vaporize a CVD film material, and a covering member provided on and thus covering an internal wall surface of the vaporization chamber.

As such, if using the CVD apparatus for a long term results in producton of a small amount of a vaporization-attributable residue in the vaporization chamber that would otherwise adhere to the internal wall surface of the vaporization chamber, the residue adheres to the member covering the internal wall surface of the vaporization chamber and does not adhere directly to the internal wall surface of the vaporization chamber. The covering member with the residue adhering thereto can be replaced to readily clean the interior of the vaporization chamber. Thus the maintenance of the vaporizer only requires a short period of time and can also be facilitated. The reduction of the time required for the maintenance of the vaporizer for a CVD apparatus can result in an enhanced operating efficiency of a CVD apparatus employing the vaporizer for use with a CVD apparatus.

In one aspect above or another aspect, in the vaporizer for a CVD apparatus the covering member may have an outermost layer containing a polymer film.

The polymer film reacts less with a solid vaporization-attributable residue as a separation of a CVD film material than typical materials constructing the vaporization chamber, such as metal. As such, the polymer film can effectively prevent an internal wall surface of the vaporization chamber from reacting with the CVD film material in the vaporization chamber, to prevent a vapolization-attributable residue from being produced in the vaporization chamber and adhering to the interior of the vaporization chamber. Thus the polymer film can more reliably prevent production of such residue.

In one aspect above or another aspect, in the vaporizer for a CVD apparatus the polymer film may include at least one of polytetrafluoroethylene (PTFE) film or a polyimide film.

In another aspect of the present invention, a CVD apparatus is comprised of a material introducing tube, a vaporization chamber, a reaction chamber and a cooling member. The material introducing tube transports a mixture containing a solution of a CVD film material and a gas carrying the solution. The vaporization chamber is connected to the material introducing tube and vaporizes the material introduced through the material introducing tube. The reaction chamber receives the vaporized, gaseous material. The cooling member cools that portion of the material introducing tube which is adjacent to the vaporization chamber.

Since the cooling member can maintain a low temperature of the material introducing tube, a solvent of the material solution does not vaporize in the material introducing tube adjacent to the vaporization chamber and hence the CVD film material does not separate in the material introducing tube. This can prevent a variation of the material's vaporization characteristics in the vaporization chamber that is attributable to a separated CVD film material (or a vaporization-attributable residue). This allows stable vaporization of the CVD film material and hence a stable supply of the vaporized CVD film material to a reaction chamber to form CVD film. Consequently, the CVD film can be provided with superior film quality.

Furthermore, since a vaporization-attributable residue is not produced, the residue cannot be delivered from the vaporization chamber as particles of an impurity nor arrive at the reaction chamber. Thus such residue cannot be mixed into a CVD film nor degrade the quality of the CVD film. This allows reliable production of CVD film with good quality. Furthermore, if the CVD apparatus of the present invention is used to provide a dielectric film for capacitors of memory devices and the like, the dielectric film can have reduced defects, providing an improved product yield of memory devices.

Furthermore, the CVD apparatus of the present invention can also prevent a solution from vaporizing in the material introducing tube, to reduce a variation in the flow rate of a mixture supplied to the vaporization chamber through the material introducing tube that would be introduced when a material solution vaporizes in the material introducing tube. Thus the vaporizer can reduce a variation in the quality of a CVD film that would otherwise be attributed to such variation in the flow rate of the material.

Furthermore, a portion of the material introducing tube adjacent to the vaporization chamber can be maintained at a low temperature and can thus have a temperature prevented from elevating due to the heat from the vaporization chamber. Thus the material introducing tube can be free of a degradation in its material that would otherwise be caused by such temperature elevation. Thus the material introducing tube can be used continuously for a long term.

In another aspect above the CVD apparatus may include a heat sink formed to transfer heat from the portion of the material introducing tube which is adjacent to the vaporization chamber.

In the CVD apparatus of the present invention, a mixture containing a material solution and a gas carrying the solution is supplied to a vaporization chamber through a material introducing tube and the material (the mixture) can thus be delivered through the material introducing tube at a flow rate higher than a liquid material conventionally introduced directly into the vaporization chamber. Thus the temperature elevation of the material introducing tube that is attributed to the heat applied in the vaporization chamber to vaporize the material can be smaller than when the liquid material is introduced directly into the vaporization chamber. Accordingly, a relatively simple cooling member, such as a heat sink connected to the material introducing tube, can be used to maintain an adequately low temperature of the material introducing tube. Providing a cooling member simpler in configuration than conventional cooling members can also reduce the cost for manufacturing the CVD apparatus.

Furthermore, the shape of such heat sink can readily be adjusted to readily change the temperature to which the material introducing tube is cooled and thus optimally cool the material introducing tube considering CVD film material types, CVD film forming conditions, and the like.

In another aspect above, in the CVD apparatus the cooling member may include a coolant path and a coolant supplying member. The coolant path may have a portion adjacent to the vaporization chamber transferring heat, and the coolant supplying member may introduce a coolant to the coolant path.

As such, if the conditions for vaporizing a material, such as the temperature of the vaporization chamber, are changed variously the amount of the coolant introduced to the coolant path can be adjusted to set any temperature of the portion of the material introducing tube adjacent to the vaporization chamber.

In another aspect above, in the CVD apparatus the cooling member may include a Peltier element formed to transfer heat from the portion thereof adjacent to the vaporization chamber.

As such, by varying the level of the current supplied to the Peltier element the amount of heat absorbed therein can be varied to readily set any temperature of the portion of the material introducing tube adjacent to the vaporization chamber, if the conditions for vaporizing a material are varied. Thus, the temperature of the material introducing tube can be set at a low temperature to prevent vaporization of the material solution and hence more reliably prevent the production of a vaporization-attributable residue in the material introducing tube.

In another aspect above, in the CVD apparatus a heat transferring member may also be provided around the portion of the material introducing tube adjacent to the vaporization chamber and the cooling member may be provided in contact with the heat transferring member.

As such, the cooling member can be provided from the portion of the material introducing tube adjacent to the vaporization chamber with the heat transferring member therebetween, resulting in an enhanced degree of freedom in designing the CVD apparatus.

In another aspect above, the CVD apparatus may be comprised of a control member disposed to control the cooling member to change the temperature of the material introducing tube.

As such, the temperature of the material introducing tube can be varied as desired and thus set to a low temperature which prevents vaporization of the material solution. This can more reliably prevent production of a vaporization-attributable residue in the material introducing tube.

Furthermore, since the material introducing tube is not heated above a predetermined temperature, a material forming the tube does not suffer the degradation attributable to the heat of the tube otherwise heated.

In another aspect above, in the CVD apparatus the CVD film material may contain an organometallic compound and the solution may be obtained by dissolving the material in an organic solvent.

In another aspect above, in the CVD apparatus the cooling member may cool the material introducing tube to no more than 80° C.

In another aspect above, the CVD apparatus may be comprised of a heating member disposed to heat the interior of the vaporization chamber in a range of 230 to 300° C., and a pressure controlling member disposed to provide a controlled pressure of no more than 30 Torr within the vaporization chamber.

As such, the conditions as above in the vaporization chamber are particularly suitable for vaporizing a material for forming a thin film of a high dielectric constant and thus allow long-term, reliable production of such thin film of a dielectric constant with good quality.

In another aspect above, in the CVD apparatus a covering member may be provided on and thus cover an internal wall surface of the vaporization chamber.

As such, if an accident or the like produces a vaporization-attributable residue that would otherwise adhere to the internal wall surface of the vaporization chamber, the residue adheres to the covering member rather than adheres directly to the internal wall surface of the vaporization chamber. The covering member with the residue adhering thereto can be replaced to readily clean the interior of the vaporization chamber. Thus the maintenance time for the CVD apparatus can be reduced, resulting in an enhanced operating efficiency of the CVD apparatus, and the CVD apparatus can also be used reliably for a long term.

Furthermore, replacing the covering member to constantly keep clean the interior of the vaporization chamber, allows CVD film to be formed constantly with good quality.

In another aspect above, in the CVD apparatus the covering member may have an outermost layer containing a polymer film.

The polymer film reacts less with a solid vaporization-attributable residue as a separation of a CVD film material than typical materials constructing the vaporization chamber, such as metal. As such, the polymer film can effectively prevent an internal wall surface of the vaporization chamber from reacting with the CVD film material in the vaporization chamber, to prevent a vaporization-attributable residue from being produced in the vaporization chamber and adhering to the interior of the vaporization chamber. Thus the polymer film can more reliably prevent production of such residue.

In another aspect above, in the CVD apparatus the polymer film may include at least one of polytetrafluoroethylene (PTFE) film or a polyimide film.

In another aspect above, the CVD apparatus is used in a semiconductor device manufacturing process.

In still another aspect of the present invention, a semiconductor device is manufactured employing the CVD apparatus in another aspect of the present invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
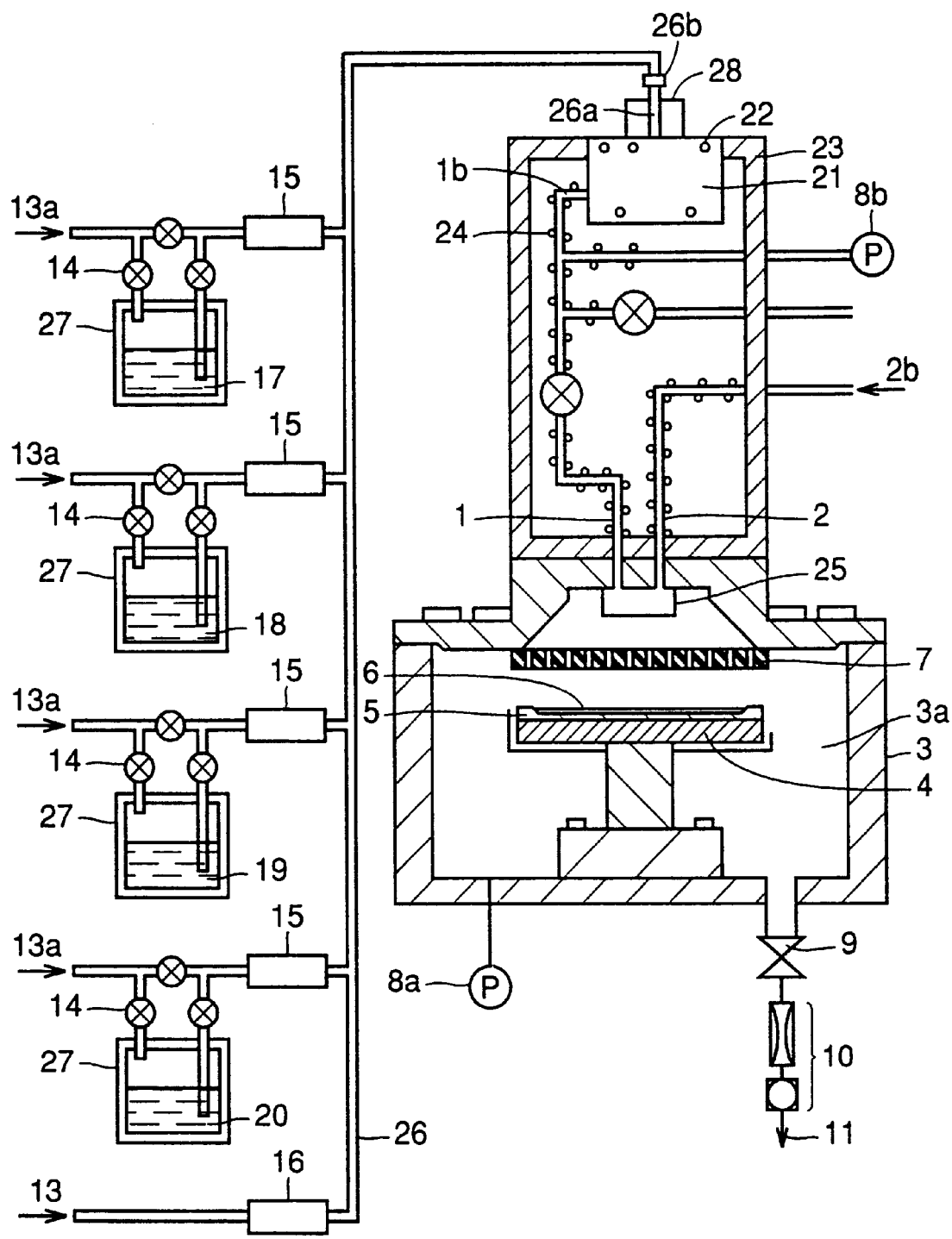
FIG. 1 schematically shows a first embodiment of a CVD apparatus according to the present invention.

The embodiments of the present invention will now be described with reference to the drawings. In the embodiment described below, Ba $(DPM)_2$, Sr $(DPM)_2$, TiO $(DPM)_2$, were used as organometallic compounds provided as CVD film materials and THF was used as an organic solvent for dissolving the materials. Furthermore, while the solutions obtained by dissolving the above solid materials in THF was used as a material solution, $O_2$ serving as an oxidizing agent was also used as a reactive gas. These materials were used to deposit a BST film. In the process for forming such BST film, the inventors estimated the amount of a vaporization-attributable residue produced in the vaporization chamber, and the like. It should be noted that identical or corresponding components in the drawings are denoted by same reference characters and a description thereof will not be repeated.

First Embodiment

A CVD apparatus will now be described with reference to FIG. 1.

The CVD apparatus is comprised of a vaporizer 21 as a vaporization chamber, and a reactor 3. Reactor 3 has a reaction chamber 3a with a heating stage 4 provided therein. A susceptor 5 is provided on heating stage 4. On susceptor 5 is placed a substrate 6 on a surface of which a CVD film is to be formed. A diffusing plate 7 is provided at the upper lid of reactor 3. Reactor 3 is also provided with a pressure gauge 8a for measuring the pressure in reaction chamber 3a. Reactor 3 is also connected to an exhaust path 11 via a vacuum valve 9 and a pressure controller 10.

Vaporizer 21 is provided with a vaporizer outlet 1b connected to a gaseous material supplying tube 1. Vaporizer 21 is connected via gaseous material supplying tube 1 to a diffuser 25 of reactor 3. Gaseous material supplying tube 1 has a surface provided with a tape heater 24. Gaseous material supplying tube 1 is also provided with a pressure gauge 8b. Diffuser 25 connects with a reactive gas supplying tube 2 for supplying a reactive gas. Vaporizer 21 and gaseous material supplying tube 1 and reactive gas supplying tube 2 are provided in a box 23 with a constant temperature.

Vaporizer 21 is provided with a rod heater 22 supplying heat for producing a gaseous material. Vaporizer 21 is also connected to a material supply tube 26a connected via a connecting member 26b to a material transport tube 26 connected via a liquid flow controller 15 to a liquid material container 27.

Material transport tube 26 is provided with a gas flow controller 16 for controlling the flow rate of nitrogen gas ($N_2$) 13 provided as a gas for carrying a liquid material. Liquid material container 27 is provided with a pressure applying tube 14 disposed to supply nitrogen gas ($N_2$ gas) 13a used to apply pressure. Liquid material containers 27 respectively hold liquid materials, i.e., a solution (a liquid material) 17 with Ba $(DPM)_2$ dissolved in THF, a liquid material 18 with Sr $(DPM)_2$ dissolved in THF, a liquid material 19 with TiO $(DPM)_2$ dissolved in THF, and THF 20.

Liquid materials 17 to 19 and THF 20 each receive a pressure applied by nitrogen gas 13a and thus supplied via liquid flow controller 15 to material transport tube 26. Liquid flow controller 15 controls the flow rate of each of liquid materials 17 to 19 and THF 20.

A cooling member 28 is provided at material supply tube 26a located at an upper portion of vaporizer 21.

The vaporizer will now be described with reference to FIG. 2.

Figure 2:
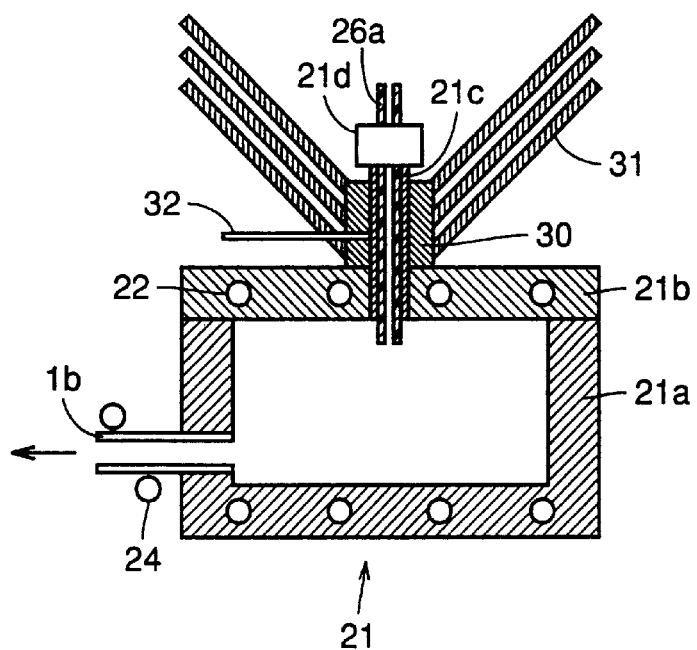
FIGS. 2–5 schematically show first to fourth embodiments of a vaporizer as a vaporizer for use with a CVD apparatus in accordance with the present invention.

Referring to FIG. 2, vaporizer 21 is comprised of a body 21a of the vaporizer and an upper lid 21b of the vaporizer. Upper lid 21b is provided with a cylindrical inlet 21c of the vaporizer. Inlet 21c is connected by a connecting member 21d to material supply tube 26a. Inlet 21c has an internal wall in contact with an external sidewall of material supply tube 26a. At inlet 21c a heat sink 31 as a cooling member is provided via a heat sink axis 30 as a heat transferring member. Heat sink axis 30 and heat sink 31 are formed of a highly heat-conductive material. Heat sink axis 30 is provided in the form of a cylinder surrounding inlet 21. Heat sink 31 may be a heat conductive member in the form of an upended cone surrounding and integral to heat sink axis 30, or it may be formed of heat transferring members in the form of a plurality of combined strips. A thermometer 32 is also provided at inlet 21c.

Body 21a of the vaporizer is provided with outlet 1b of the vaporizer. Outlet 1b is connected to gaseous material supplying tube 1 (shown in FIG. 1). Outlet 1b and gaseous material supplying tube 1 each have a surface provided with tape heater 24, as described above. Rod heater 22 is provided in each of body 21a and upper lid 21b.

The operation of the CVD apparatus of the present invention will now be described.

In the CVD apparatus shown in FIG. 1, nitrogen gas 13 is supplied via gas flow controller 16 to material transport tube 26 which also receives liquid materials 17 to 19 and THF 20 from liquid material containers 27 via liquid flow controllers 15. Thus, liquid materials 17 to 19 and THF 20 and nitrogen gas 13 as a carrier gas are mixed in a material transport tube 26 to provide a mixture of liquids and a gas. The mixture is supplied via material supply tube 26a into vaporizer 21, which receives therein liquid materials 17 to 19 and THF 20 dispersed or sprayed from an end of material supply tube 26a. Since vaporizer 21 is heated by rod heater 22, liquid materials 17 to 19 colliding with the internal wall of vaporizer 21 vaporize instantly.

The liquid materials vaporized in vaporizer 21 (a gaseous material) is exhausted through outlet 1b of the vaporizer. The gaseous material is then supplied via gaseous material supplying tube 1 into reaction chamber 3a. The gaseous material is maintained at a predetermined temperature, since gaseous material supplying tube 1 is heated by tape heater 24 and also held in box 23 with a constant temperature. Furthermore, an oxygen gas 2b as a reactive gas is also supplied to reaction chamber 3a via reactive gas supplying tube 2. Reactive gas 2b is also controlled to have a predetermined temperature, since reactive gas supplying tube 2, as well as gaseous material supplying tube 1, is heated by tape heater 24 and also held in box 23 with a constant temperature. The gaseous material supplied via gaseous material supplying tube 1 and reactive gas 2b supplied via reactive gas supplying tube 2 are mixed in diffuser 25 and then supplied into reaction chamber 3a. The gaseous material and reactive gas 2b thus react with each other and forms a BST film on substrate 6 heated by heating stage 4. It should be noted that substrate 6 may be a silicon wafer or the like. A gaseous mixture of the gaseous material and the reactive gas 2b having failed to contribute to the formation of the BST film is exhausted from reaction chamber 3a through exhaust path 11 by means of a vacuum pump.

Furthermore, the pressure in reaction chamber 3a was controlled by pressure controller 10 in a range of 1 to 10 Torr. Furthermore, heating stage 4 was heated to 400 to 600° C., since in employing a CVD system to form a BST film, the BST film's step coverage is enhanced as the atmosphere temperature is reduced. Furthermore, the supply rate of liquid materials 17 to 19 and deposition time were adjusted to form the BST film at a deposition rate of approximately 3 nm/min. Thus a BST film was formed with a thickness of 30 nm and a composition ratio ((Ba+Sr)/Ti) of approximately 1.0.

Since such BST film is used as a dielectric film of a capacitor, it is formed on a lower electrode of Pt, Ru or the like. Then, sputtering is employed to provide Pt, Ru or the like as an upper electrode on the BST film. Thus a semiconductor device can be fabricated with a capacitor. Furthermore, such semiconductor device can be used as a sample to measure the BST film's electrical characteristics (current leakage, equivalent oxide film thickness, and the like).

Referring now to FIGS. 1 and 2, vaporizer 21 as a vaporizer for use with a CVD apparatus of the present invention is provided with heat's ink 31 as a cooling member and heat sink axis 30 as a heat transferring member, as described above. The heat of material supply tube 26a is transferred via connecting member 21d or directly to inlet 21c of the vaporizer. Since inlet 21c is provided with heat sink axis 30, the heat transferred to inlet 21c is further transferred to heat sink axis 30. The heat transfer to heat sink axis 30 is further transferred to heat sink 31 and the heat transferred to heat sink 31 is thus emitted therefrom into the atmosphere. Thus the temperature of material supply tube 26a can be lower than when heat sink 31 as cooling member 28 (see FIG. 1) is not provided.

More specifically, a BST film was formed, with liquid materials 17 to 19 and THF 20 supplied at a rate of 1 cc/min, nitrogen gas 13 as a carrier gas supplied at a rate of 200 cc/min, and vaporizer 21 heated to 250° C. With the above conditions, in a CVD apparatus without cooling member 28, inlet 21c of the vaporizer and material supply tube 26a had a temperature of approximately 80° C. With the above condition, in the CVD apparatus of the present invention, inlet 21c and material supply tube 26a had a temperature of approximately 40° C. and the temperature of material supply tube 26a can thus be maintained lower than conventional. Since the solvent of the liquid materials or THF has a boiling point of approximately 60° C., the CVD apparatus of the present invention can prevent THF from vaporizing in material supply tube 26a. Thus the CVD apparatus of the present invention can be free of a separation of a material in material supply tube 26a that would be conveniently attributable vaporization (or evaporation) of the liquid-material solvent or THF. Thus the apparatus can prevent the BST film's quality from degrading due to a vaporization-attributable residue otherwise produced in vaporizer 21.

Furthermore, since the solvent of the liquid materials or THF does not vaporize in material supply tube 26a, there is not a disadvantageous variation in the flow rate of the mixture of the liquid materials and the carrier gas supplied through material supply tube 26a. Thus, the provided conditions for vaporizing the material in vaporizer 21 can be stabilized to provide a uniform quality to a BST film.

Furthermore, since a vaporization-attributable residue is not produced in vaporizer 21, the residue cannot be delivered through material gas supplying tube 1 into reaction chamber 3a nor introduced into a BST film to be formed or degrade the quality of the BST film. Thus the BST film is provided with good quality.

Furthermore, the temperature of material supply tube 26a maintained lower than conventional can prevent the properties of the material(s) forming material supply tube 26a from degrading due to the heat caused by the CVD apparatus used for a long term.

Although heat sink 31 is structured of 3-layer thin plates in vaporizer 21 shown in FIG. 2, heat sink 31 different in shape and number from that shown in FIG. 2 can also be as effective as that shown in FIG. 2. Furthermore, the shape, size, number and like of heat sink 31 may be optimally selected depending on various conditions, such as the material vaporizing temperature in vaporizer 21, the flow rate of the mixture of the liquid materials and the carrier gas, and the like. Preferably, heat sink 31 is formed of a material which is highly heat conductive and also capable of reflecting infrared and the like. For example, heat sink 31 may be formed of aluminum. Furthermore, heat sink 31 processed to have a coarse surface and hence an increased surface area can obtain a further enhanced heat emitting ability.

Second Embodiment

A vaporizer will now be described with reference to FIG. 3.

Figure 3:
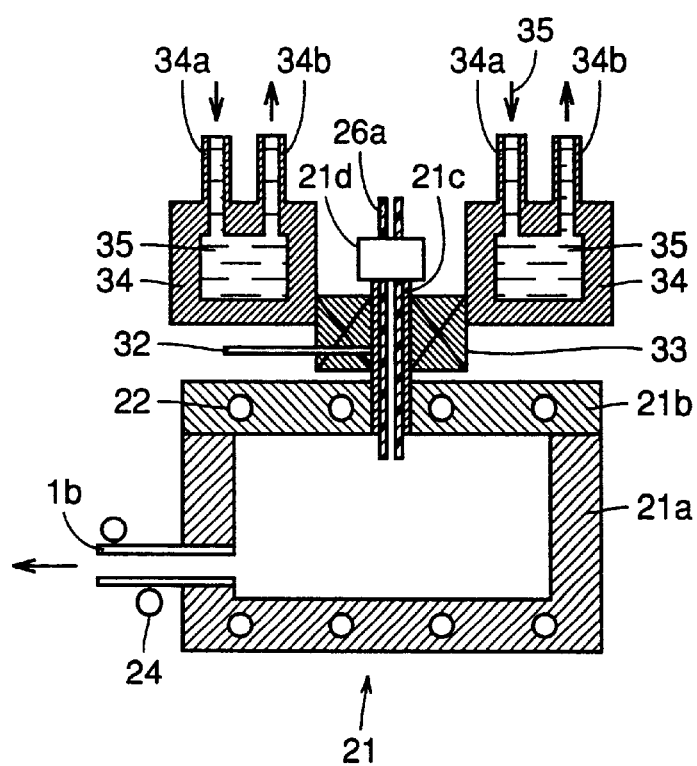

The FIG. 3 vaporizer 21 is generally similar in configuration to the FIG. 2 vaporizer, although the FIG. 3 vaporizer includes a cooling chamber 34 provided around inlet 21c of the vaporizer via a coolant-chamber axis 33 in the form of a cylinder of a heat conductive substance. Coolant-chamber axis 33 as a heat transferring member is fixed in contact with a side wall of inlet 21c of the vaporizer. Cooling chamber 34 is provided with inlet 34a of the cooling chamber and an outlet 34b of the cooling chamber. Cooling chamber 34 receives via inlet 34a of the cooling chamber. a liquid or gaseous coolant 35 of a control temperature.

As in the first embodiment of the present invention, the heat of material supply tube 26a is transferred to inlet 21c of the vaporizer. The heat transferred to inlet 21c is then transferred via cooling-chamber axis 33 to cooling chamber 34. The heat thus transferred from material supply tube 26a to cooling chamber 34 is absorbed in cooling chamber 34 by coolant 35 which is then exhausted from outlet 34b of the cooling chamber. After coolant 35 has transferred the heat externally, it is again introduced through inlet 34a of the cooling chamber into cooling chamber 34. With cooling member 28 (FIG. 1) configured as above, the temperature of inlet 21c of the vaporizer was measured under conditions similar to those in the first embodiment of the present invention. More specifically, water as coolant 35 with a temperature of 10° C. was introduced through inlet 34a of the cooling chamber into cooling chamber 34. As a result, inlet 21c of the vaporizer and material supply tube 26a had a temperature of 20 to 40° C., and the present embodiment has been found to be as effective as the cooler of the first embodiment of the present invention.

Furthermore, a coolant flow adjuster for adjusting the flow rate of coolant 35, a coolant temperature adjuster for adjusting the temperature of coolant 35 and the like can also be provided as a controlling member to maintain a constant temperature of inlet 21c of the vaporizer and material supply tube 26a if a condition for vaporizing a material varies in vaporizer 21.

In the FIG. 3 vaporizer 21, cooling chambers 34 sandwich inlet 21c of the vaporizer on the right hand and left side thereof. However, the configuration of cooling chamber 34, including number, arrangement and the like, is not limited to that shown in FIG. 3 and may be any other configurations. Preferably, cooling chambers 34 cylindrically surround material supply tube 26a to circumferentially, uniformly cool material supply tube 26a. Furthermore, the flow rate and temperature of coolant 35 can be optimally selected to accommodate various conditions, such as the temperature at which a material is vaporized in vaporizer 21, the rate at which the material is supplied, and the like.

Third Embodiment

A vaporizer will now be described with reference to FIG. 4.

Figure 4:
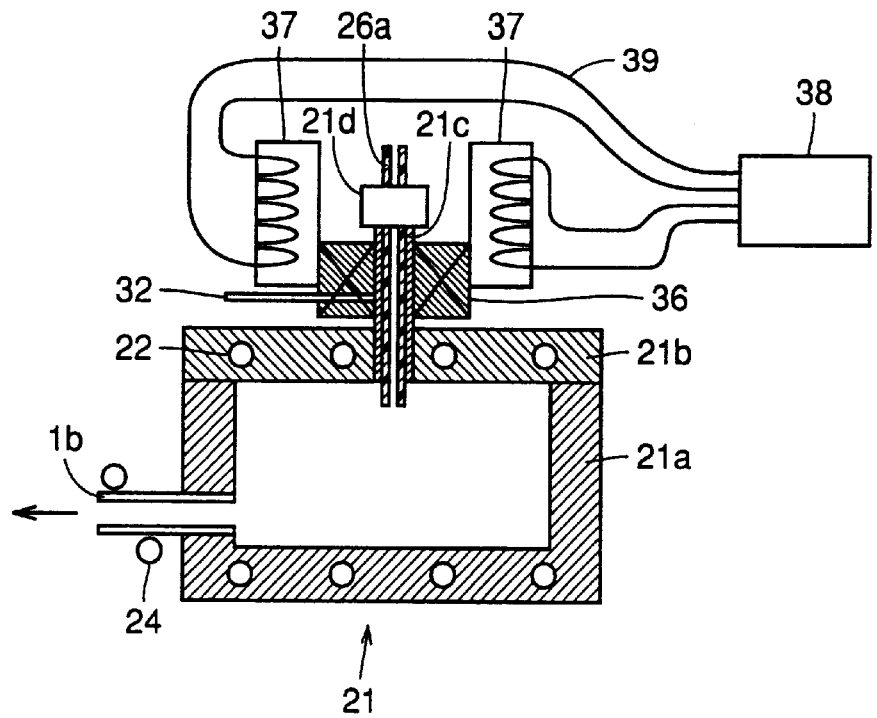

The FIG. 4 vaporizer 21 is generally similar in configuration to the FIG. 2 vaporizer, although in the FIG. 4 vaporizer 21, cooling member 28 (FIG. 1) is a Peltier cooler 37 using a Peltier element. Peltier cooler 37 is fixed around inlet 21c of the vaporizer via a heat transferring member or a cylindrical axis 36 fixing a heat emitting portion. Axis 36 fixing a heat emitting portion is fixed in contact with a sidewall of inlet 21c of the vaporizer. Peltier cooler 37 is connected via a connecting line 39 to a controller 38 serving as a controlling member. Peltier cooler 37 may be provided in the form of a cylinder surrounding inlet 21c of the vaporizer or a plurality of Peltier coolers may be arranged to surround inlet 21c of the vaporizer.

The heat of material supply tube 26a is transferred to inlet 21c of the vaporizer, as in the first embodiment of the present invention. The heat transferred to inlet 21c is transferred to Peltier cooler 37 via axis 36 fixing a heat emitting portion. Through receiving a current from controller 38, Peltier cooler 37 absorbs the heat transferred from inlet 21c of the vaporizer. Thus, Peltier cooler 37 absorbs the heat of inlet 21c of the vaporizer and material supplied tube 26a. As such, the vaporizer of the present embodiment can be as effective as the FIG. 3 vaporizer of the second embodiment.

Furthermore, the vaporizer of the present embodiment is also different from the FIG. 3 vaporizer in that it dispenses with coolant 35 (FIG. 3) such as water. As such, the present embodiment can provide a further increased degree of freedom in the design and configuration of vaporizer 21 and the cooling member.

Fourth Embodiment

A vaporizer will now be described with reference to FIG. 5.

Figure 5:
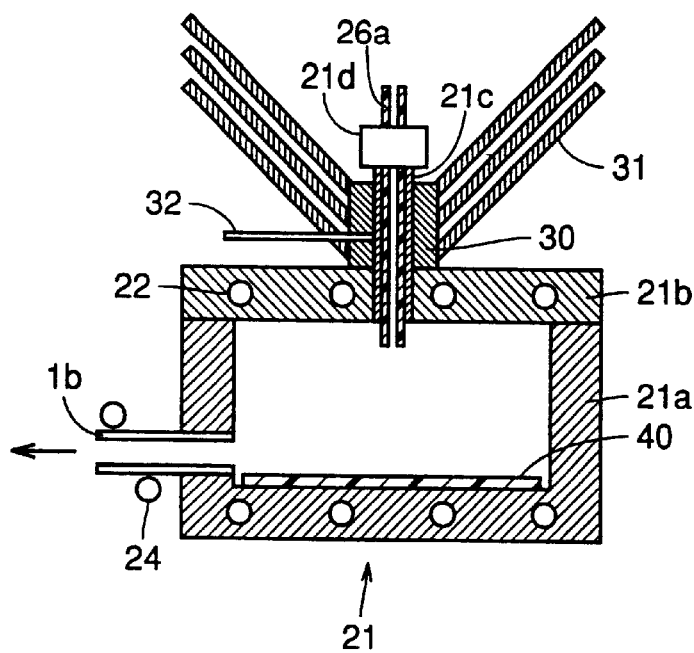

The FIG. 5 vaporizer 21 is generally similar in configuration to the FIG. 2 vaporizer of the first embodiment, although in the FIG. 5 vaporizer 21 a plate 40 having a surface with a polymer cover film formed thereon is provided in vaporizer 21 on a bottom surface thereof.

As such, in addition to the effect obtained in the vaporizer of the first embodiment, a liquid material supplied through an end of material supply tube 26a can be advantageously prevented from directly contacting the internal bottom surface of vaporizer 21. Thus, in the process for vaporizing the liquid material advantageously does not contact a metal forming body 21a of the vaporizer nor does a vaporization-attributable residue react with or adhere to an internal wall surface of vaporizer 21. As such, in the maintenance of vaporizer 21, vaporizer 21 can be internally cleaned by such a simple operation as replacing plate 40. Thus, the time and labor required for the maintenance of vaporizer 21 can be reduced.

The polymer formed on a surface of plate 40 can be a polytetrafluoroethylene (PTFE) film or a polyimide film. Furthermore, the temperature to which vaporizer 21 is heated is optimally selected to accommodate a material for a CVD film to be formed. However, if plate 40 with such a polymer cover film is used, the heat-resistive temperature of a material of the polymer cover film should also be considered in selecting the temperature to which vaporizer 21 is heated. For example, when the polymer cover film is a PTFE film, vaporizer 21 is adapted to be heated to approximately no more than 300° C. If the polymer cover film is a polyimide film, vaporizer 21 is adapted to be heated to approximately no more than 400° C.

Figure 6:
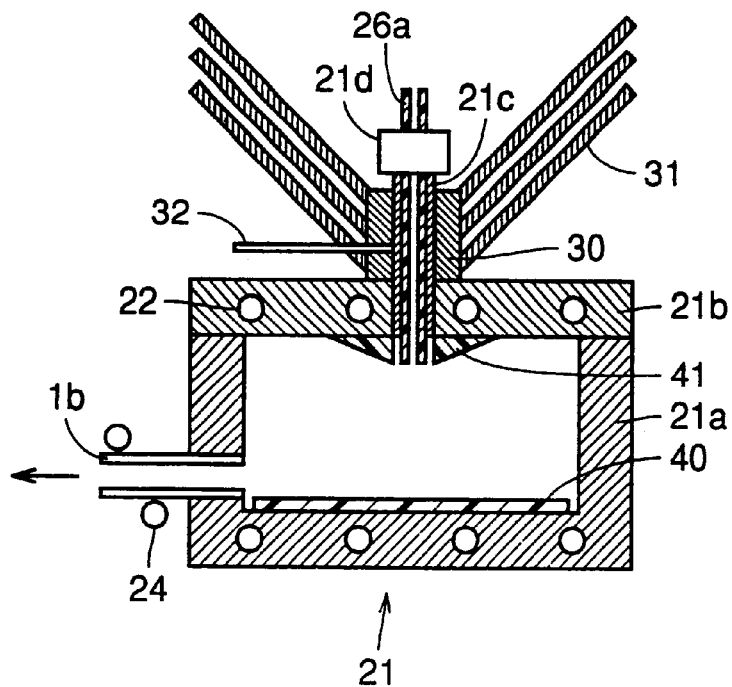
FIG. 6 schematically shows a variation of the fourth embodiment of the vaporizer as the vaporizer for use with a CVD apparatus in accordance with the present invention.

Furthermore, as shown in FIG. 6, an auxiliary plate 41 having a surface with a polymer film formed thereon may also be provided around an end of material supply tube 26a, (i.e., on an internal wall of upper lid 21b of the vaporizer).

Auxiliary plate 41 as described above is formed for the following reason: depending on the flow rate of a material supplied through material supply tube 26a into vaporizer 21, a dispersing liquid material can also adhere to around the end of material supply tube 26a. Against such a dispersing liquid material, auxiliary plate 41 as shown in FIG. 6 can be as effective as plate 40.

In the FIGS. 5 and 6 vaporizers, a plate with a polymer cover film may also be provided on an inner sidewall of vaporizer 21 to more reliably prevent a vaporization-attributable residue from adhering to the internal wall surface of vaporizer 21.

Fifth Embodiment

A vaporizer will now be described with reference to FIG. 7.

Figure 7:
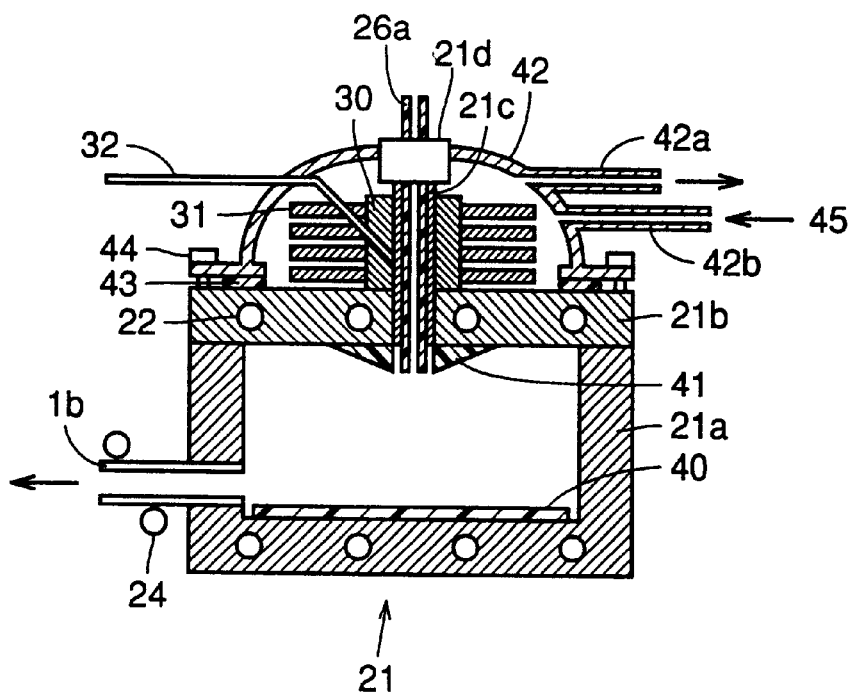
FIG. 7 schematically shows a fifth embodiment of the vaporizer as the vaporizer for use with a CVD apparatus in accordance with the present invention.
Figure 8:
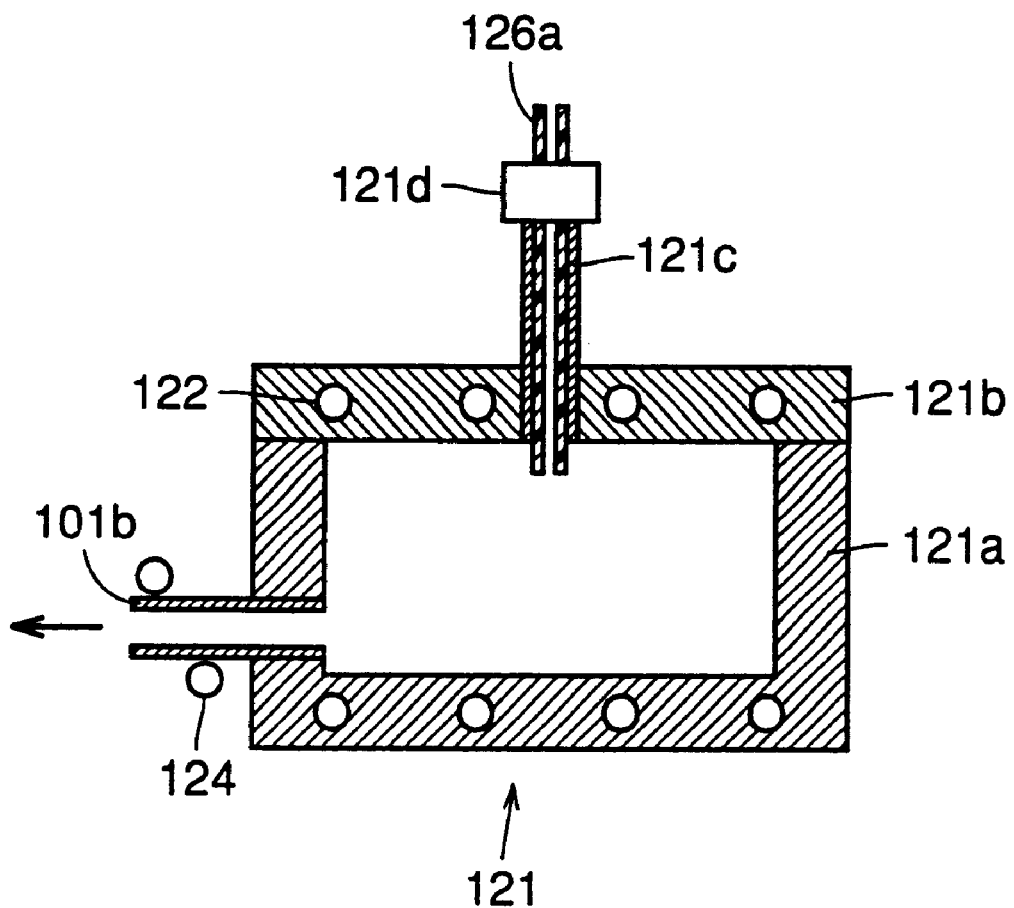
FIG. 8 schematically shows a vaporizer as a vaporizer for use with a CVD apparatus related to the present invention.

The FIG. 7 vaporizer 21 is basically similar in configuration to the FIG. 6 vaporizer, although the FIG. 7 vaporizer 21 is provided with a lid 42 of a cooling chamber to cover heat sink 31.

Lid 42 of the cooling chamber is fixed to upper lid 21b of the vaporizer via a screw 44. A sealing member 43 is also arranged at a junction of lid 42 of the cooling chamber and upper lid 21b of the vaporizer. Lid 42 of the cooling chamber is provided with a coolant outlet 42a and a coolant inlet 42b. A cooling gas 45 supplied through coolant inlet 42b into the cooling chamber is controlled to have a low temperature. As such, inlet 21c of the vaporizer and material supply tube 26a can be cooled more efficiently. As such, in addition to the effect obtained in the FIG. 6 vaporizer, the FIG. 7 vaporizer 21 can more accurately control the temperature of inlet 21c of the vaporizer and that of material supply tube 26a to effectively, reliably prevent a vaporization-attributable residue from being produced therein. The present embodiment can also reliably prevent a vaporization-attributable residue from being produced when the process conditions are significantly changed, such as the temperature to which vaporizer 21 is heated, the rate at which a material is supplied.

It should be noted that vaporizers shown in the second to fifth embodiments of the present invention are applicable to the FIG. 1 CVD apparatus.

Sixth Embodiment

The CVD apparatus of the present invention was then examined with respect to a relationship between an operating condition of the vaporizer and production of a vaporization-attributable residue. Table 1 provides a result of the examination.

TABLE 1

| Temperature of Material Supply Tube (° C.) | -20 | 0 | 20 | 40 | 60 | 80 | 100 |
| --- | --- | --- | --- | --- | --- | --- | --- |
| Residue Production Rate (%) | 0 | 0 | 0 | 0 | 0 | 2 | 5 |

Table 1 provides the rate of production of a vaporization-attributable residue with respect to the temperature of material supply tube 26a. The residue production rate represents the weight ratio (%) of a vaporization-attributable residue remaining in the vaporizer (the amount of the separation of a solid material component supplied to the vaporizer to form a CVD film) to the amount of the solid material component supplied to the vaporizer to form the CVD film. In measuring the residue production rate, the vaporization chamber received the liquid materials used in the first embodiment, the liquid materials had a total flow rate of 1 cc/min, nitrogen gas 13 as a carrier gas (FIG. 1) had a flow rate of 200 cc/min, the vaporizer was heated to 250° C., and a pressure of 10 Torr was created in the vaporizer. Furthermore, the cooling member used was that shown in the second or third embodiment. As is apparent from Table 1, the material supply tube having a temperature of no more than 80° C. can provide a reduced residue production rate. Preferably, the material supply tube has a temperature ranging from 0 to 60° C. to reliably prevent production of the residue. It should be noted that when the material supply tube has a temperature of no more than 0° C. dew can form at the exterior of the material supply tube, so that practically the material supply tube preferably has a temperature in a range no less than 0° C.

Thus it can be understood that production of a vaporization-attributable residue can be prevented when the material supply tube adjacent to vaporizer 21 has a temperature of no more than 80° C. This allows long term, reliable production of CVD film. More specifically, the material supply tube preferably has a temperature ranging from 0 to 60° C. to reliably prevent production of the vaporization-attributable residue.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A vaporizer for use with a CVD apparatus, comprised of:

a material introducing tube commonly coupled to sources of a solution of material for a CVD film and a gas carrying the solution, respectively and carrying a mixture of the material and gas;

a vaporization chamber connected to said material introducing tube, vaporizing said material introduced through said material introducing tube;

a cooling member contacting said material introducing tube for cooling that portion of said material introducing tube adjacent to said vaporization chamber, wherein the cooling member includes a heat sink formed to transfer heat from said portion of the material introducing tube adjacent to said vaporization chamber;

a heat transferring member provided around said portion of the material introducing tube adjacent to said vaporization chamber, wherein said cooling member is provided in contact with said heat transferring member, and the heat transferring member is in contact with that portion of the material introducing tube that is adjacent to the vaporization chamber, and the heat transferring member has an annular shape such that it surrounds the periphery of the portion of the material introducing tube adjacent to said vaporization chamber; and said heat sink connected to an outer circumferential portion of the heat transferring member.

2. The vaporizer according to claim 1, wherein:

said material contains an organometallic compound; and said solution is obtained by dissolving said material in an organic solvent.

3. The vaporizer according to claim 1, wherein said cooling member cools said material introducing tube to no more than 80° C.

4. The vaporizer according to claim 1, comprising:

a heating member heating an interior of said vaporization chamber to a range of 230° C. to 300° C.; and a pressure controlling member controlling a pressure in said vaporization chamber to create a pressure of no more than 30 Torr in said vaporization chamber.

* * * * *